United States Patent [19]
Choi

[11] Patent Number: 5,510,289
[45] Date of Patent: Apr. 23, 1996

[54] METHOD FOR FABRICATING STACK CAPACITOR OF SEMICONDUCTOR DEVICE

[75] Inventor: Yang K. Choi, Kyoungki, Rep. of Korea

[73] Assignee: Hyundai Electronics Industries Co. Ltd., Kyoungki, Rep. of Korea

[21] Appl. No.: 457,222

[22] Filed: Jun. 1, 1995

[30] Foreign Application Priority Data

Jun. 22, 1994 [KR] Rep. of Korea .................... 94-14250
Jun. 28, 1994 [KR] Rep. of Korea .................... 94-15010

[51] Int. Cl.$^6$ ............................................. H01L 21/8242
[52] U.S. Cl. ............................ 437/60; 437/915; 437/919
[58] Field of Search .......................... 437/47, 60, 915, 437/919; 148/DIG. 14

[56] References Cited

U.S. PATENT DOCUMENTS 5,290,726  3/1994  Kim ........................................ 437/60
5,330,928  7/1994  Tseng ..................................... 437/60
5,449,635  9/1995  Jun ....................................... 437/919

*Primary Examiner*—Chandra Chaudhari
*Attorney, Agent, or Firm*—Morgan & Finnegan

[57] ABSTRACT

A method for fabricating a stack capacitor to be used for a highly integrated semiconductor device such as a DRAM of 64 mega grade or greater. Using the characteristic that a selective oxide film is likely to be deposited only over an oxide film and a good step coverage characteristic of polysilicon film, the stack capacitor is fabricated to have wing structures of a right 90°-inverted U shape and a left 90°-inverted U shape respectively at opposite ends of its storage electrode. These wing structures result in an increase in the surface area of the storage electrode.

6 Claims, 8 Drawing Sheets

METHOD FOR FABRICATING STACK CAPACITOR OF SEMICONDUCTOR DEVICE

BACKGROUND OF THE INVENTION

1. Field of the Invention

The present invention relates to a method for fabricating a stack capacitor of a semiconductor device, and more particularly to a method for fabricating a stack capacitor to be used for a highly integrated semiconductor device by using simple process steps.

2. Description of the Prior Art

Generally, a high integration of dynamic random access memories (DRAMs), which are a kind of semiconductor memory device, involves inevitably a reduction in the area of a cell and thereby a limitation on obtaining a sufficient capacitance. In order to solve problems caused by such a reduction in the unit area of a cell inevitably involved to achieve high integration of integrated semiconductor circuits, efforts have been made to develop sophisticated process techniques and to ensure the reliability of devices and a sufficient capacitance of a cell.

As a part of such efforts, there have been proposed a method of increasing an efficient area of a capacitor and a method of using a high dielectric thin film. The development of high dielectric thin films has not reached the level for the high dielectric thin films to be applied to semiconductor devices. In this regard, research for obtaining a capacitance of a desired level or greater at a small area is being actively made.

For example, there have been proposed a three-dimensional structure of capacitor such as pin structure, cylinder structure and stack structure. However, such a three-dimensional capacitor structure requires use of more complex process steps for obtaining more increased capacitance. Moreover, this structure involves an increase in the height of a capacitor, thereby resulting in a problem with the topology at a subsequent metal wiring forming step.

SUMMARY OF THE INVENTION

Therefore, an object of the invention is to provide a method for fabricating a stack capacitor, capable of simplifying the fabrication while increasing the capacitance of the capacitor, and maximizing the surface area of the capacitor without increasing the height of the capacitor.

In accordance with one aspect, the present invention provides a method for fabricating a stack capacitor of a semiconductor device, comprising the steps of: forming a first oxide film for a planarization over a substrate, depositing a first nitride film over the first oxide film, and then forming a capacitor contact hole in the resulting structure obtained after the deposition of the first nitride film; depositing a doped, first polysilicon film over the entire exposed surface of the resulting structure obtained after the formation of the contact hole such that the polysilicon film fills the contact hole, and then sequentially depositing a second nitride film and a second oxide film over the first polysilicon film; sequentially etching the second oxide film, the second nitride film and the first polysilicon film by a lithography process using a storage electrode mask, thereby forming a pattern constituted by the films left after the etching; thickly growing a selective, third oxide film over the second oxide film; depositing a doped, second polysilicon film over the entire exposed surface of the resulting structure obtained after the growth of the third oxide film; etching the second polysilicon film using a blanket dry etch, thereby forming patterns of the second polysilicon film respectively on side walls of the pattern of the first polysilicon film and second nitride film; removing the third oxide film and the second oxide film; removing the second nitride film and the first nitride film; and forming a dielectric film over a storage electrode constituted by the pattern of the first polysilicon film and the patterns of the second polysilicon film, and then forming a plate electrode over the dielectric film.

In accordance with another aspect, the present invention provides a method for fabricating a stack capacitor of a semiconductor device, comprising the steps of: forming a first oxide film for a planarization over a substrate, and then forming a capacitor contact hole in the resulting structure obtained after the formation of the first oxide film; depositing a doped, first polysilicon film over the entire exposed surface of the resulting structure obtained after the formation of the contact hole such that the polysilicon film fills the contact hole, and then depositing a second oxide film over the first polysilicon film; sequentially etching the second oxide film and the first polysilicon film by a lithography process using a storage electrode mask, thereby forming a pattern constituted by the films left after the etching; forming a photoresist film over a portion of the first oxide film exposed after the etching such that the photoresist film extends up to a selected height portion of the second oxide film; growing a selective, third oxide film over a portion of the second oxide film exposed after the formation of the photoresist film, and then removing the remaining photoresist film; depositing a doped, second polysilicon film over the entire exposed surface of the resulting structure obtained after the removal of the photoresist film, and then etching the second polysilicon film using a dry etch, thereby forming patterns of the second polysilicon film respectively on side walls of the pattern of the first polysilicon film and second oxide film; removing the third oxide film and the second oxide film and simultaneously forming undercuts beneath the patterns of the first and second polysilicon films; and forming a dielectric film over a storage electrode constituted by the patterns of the first and second polysilicon films, and then forming a plate electrode over the dielectric film.

BRIEF DESCRIPTION OF THE DRAWINGS

Other objects and aspects of the invention will become apparent from the following description of embodiments with reference to the accompanying drawings in which.

DETAILED DESCRIPTION OF THE PREFERRED EMBODIMENTS

FIGS. 1 to 7 are sectional views respectively illustrating sequential steps of a method for fabricating a stack capacitor applied to a DRAM in accordance with a first embodiment of the present invention. For the convenience of illustration, the DRAM structure is shown as not including a metal oxide silicon field effect transistor (MOSFET) to which the capacitor is connected. Actually, the MOSFET is formed on a substrate disposed beneath the capacitor.

Figure 1:
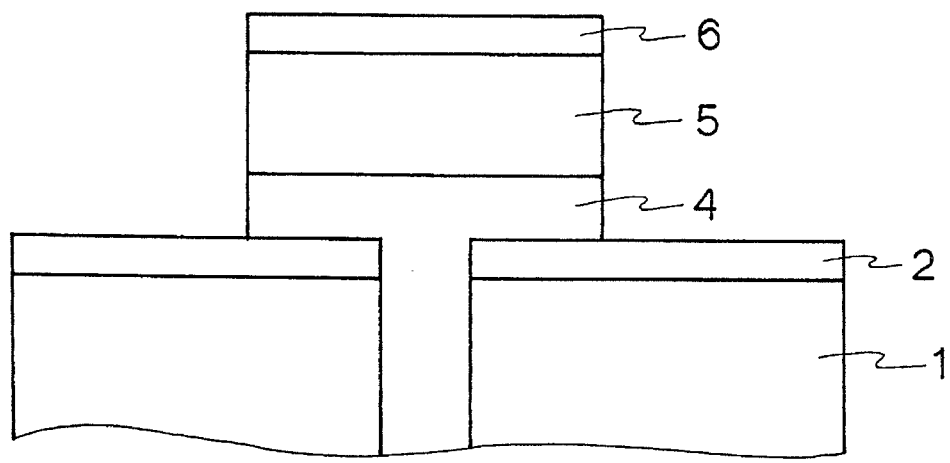
FIGS. 1 to 7 are sectional views respectively illustrating sequential steps of a method for fabricating a stack capacitor of a semiconductor device in accordance with a first embodiment of the present invention.

In accordance with this method, a first oxide film 1 for a planarization is formed over a structure obtained after forming a field oxide film and the MOSFET over the substrate in a conventional manner, as shown in FIG. 1. Over the first oxide film 1, a first nitride film 2 is then deposited. Thereafter, the first nitride film 2 and first oxide film 1 are etched at their portions corresponding to a region where a storage electrode of the capacitor to be formed will be in contact with the substrate. By the etching step, a contact hole is formed. Over the entire exposed surface of the resulting structure, a doped, first polysilicon film 4 is then coated. Subsequently, a second nitride film 5 and a second oxide film 6 are deposited, in this order, over the first polysilicon film 4. By a lithography process using a capacitor storage electrode mask, the second oxide film 6, second nitride film 5 and first polysilicon film 4 are sequentially etched to form a desired pattern. The first nitride film 2 is adapted to ensure a selective growth of a third oxide film at a subsequent step. That is, the first nitride film 2 serves to prevent the third oxide film from being grown over the first oxide film. The first oxide film 1 is comprised of a boro-phospho silicate glass (BPSG) film.

Figure 2:
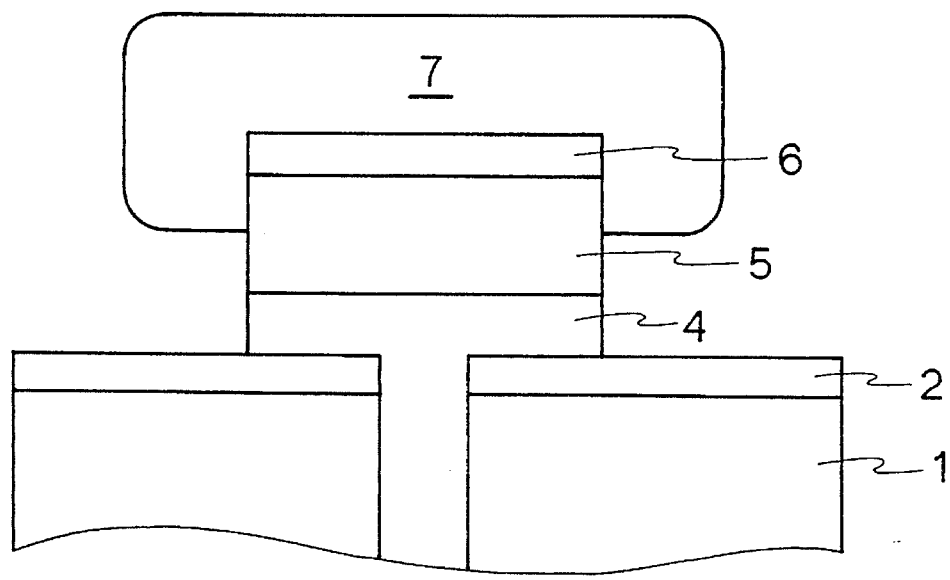

Thereafter, a selective oxide film is grown over the second oxide film 6, thereby forming the third oxide film which is denoted by the reference numeral 7, as shown in FIG. 2. The third oxide film 7 is excessively grown so that it extends downwards beyond side surfaces of the second oxide film 6 and thereby covers a portion of each side surface of the second nitride film 5. The third oxide film 7 is made of $O_3$-tetra ethyl ortho silicate (TEOS), phospho silicate glass (PSG) or TEOS.

Figure 3:
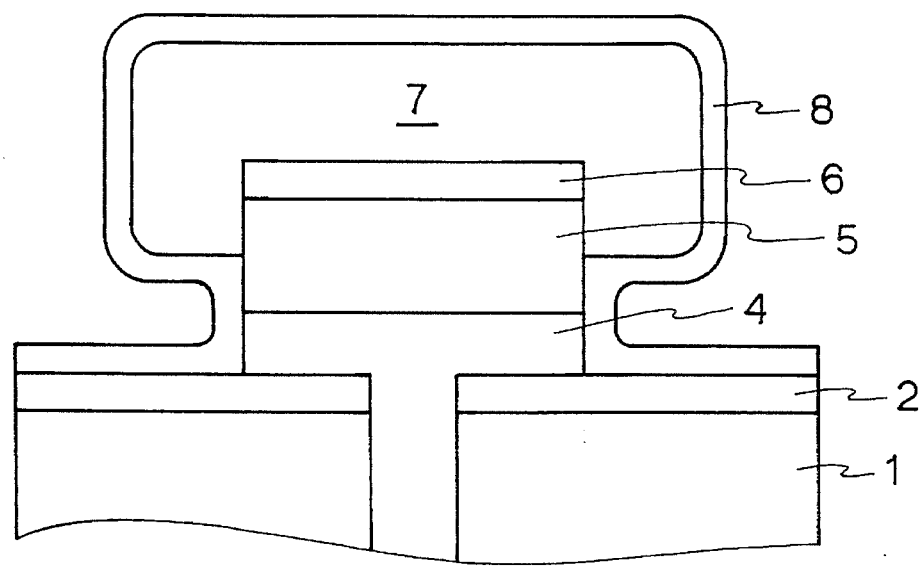

Over the entire exposed surface of the resulting structure including the third oxide film 7, a doped, second polysilicon film 8 is then deposited to a desired thickness, as shown in FIG. 3. The second polysilicon film 8 exhibits a good step coverage so that it is deposited in a uniform thickness even over a region defined below an overhanging portion of the third oxide film 7.

Figure 4:
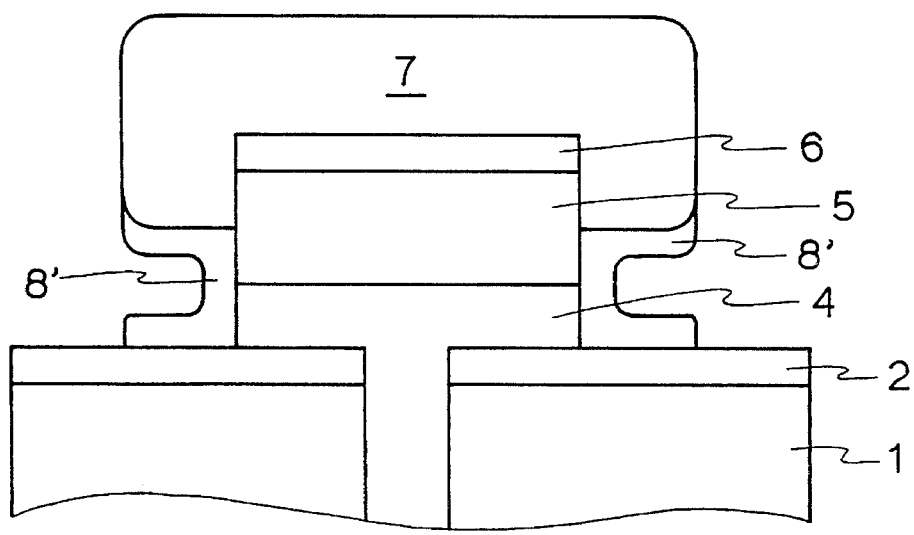

Thereafter, the second polysilicon film 8 is subjected to a blanket dry etch, thereby forming patterns 8' of the second polysilicon film 8 at opposite portions of the structure constituted by the first polysilicon film 4 and second nitride film 5, as shown in FIG. 4. One of the patterns 8' has a right 90° -inverted U shape while the other pattern 8' has a left 90°-inverted U shape.

Figure 5:
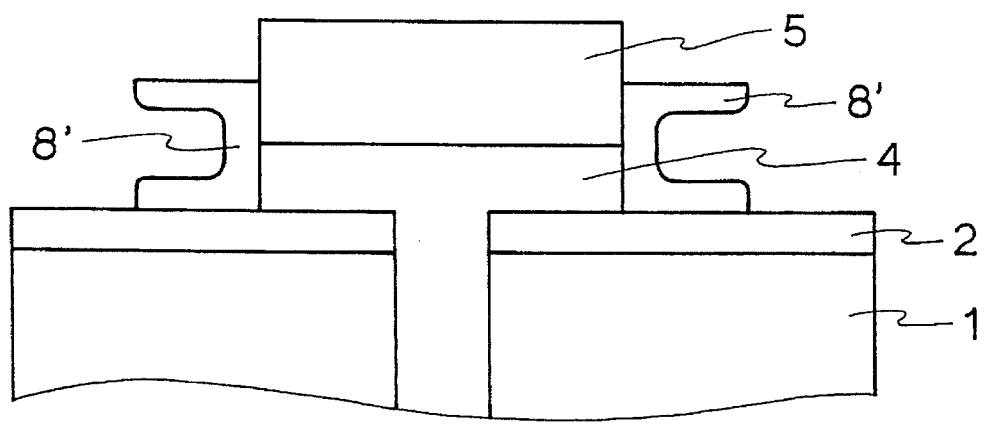

The resulting structure is then subjected to an isotropic or anisotropic etch to remove the third oxide film 7 and second oxide film 6, as shown in FIG. 5.

Figure 6:
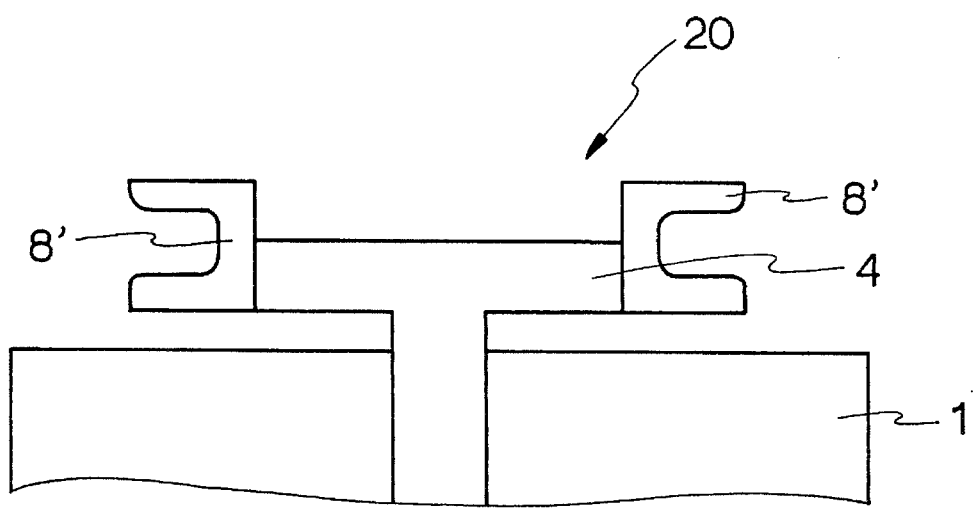

Subsequently, the resulting structure is then subjected to an isotropic etch to remove the second nitride film 5 and first nitride film 2, as shown in FIG. 6. As a result, a storage electrode 20 is obtained, which is constituted by the first polysilicon film 4 and the patterns 8' of the second polysilicon film at opposite ends of the first polysilicon film 4.

Figure 7:
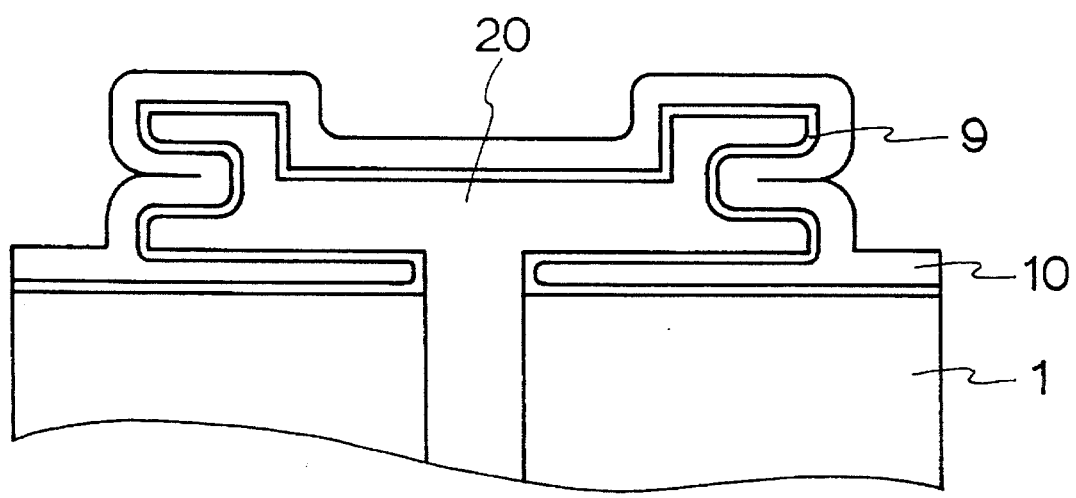

A dielectric film 9 of the capacitor is then formed over the storage electrode 20, as shown in FIG. 7. Finally, a doped polysilicon film is deposited over the resulting structure, thereby forming a plate electrode 10 of the capacitor.

FIGS. 8 to 16 are sectional views respectively illustrating sequential steps of a method for fabricating a stack capacitor applied to a DRAM in accordance with a second embodiment of the present invention. For the convenience of illustration, the DRAM structure is shown as not including a MOSFET to which the capacitor is connected. Actually, the MOSFET is formed on a substrate disposed beneath the capacitor.

Figure 8:
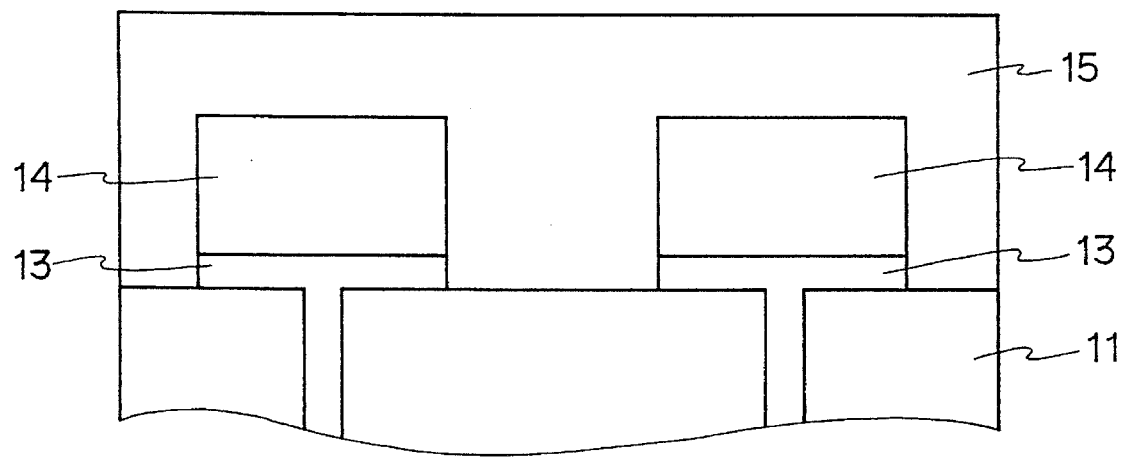
FIGS. 8 to 15 are sectional views respectively illustrating sequential steps of a method for fabricating a stack capacitor of a semiconductor device in accordance with a second embodiment of the present invention.

In accordance with this method, a first oxide film 11 for a planarization is formed over a structure obtained after forming a field oxide film and the MOSFET (not shown) over the substrate in a conventional manner, as shown in FIG. 8. The first oxide film 1 is then etched at its portion corresponding to a region where a storage electrode of the capacitor to be formed will be in contact with the substrate. By the etching step, a contact hole is formed. Over the entire exposed surface of the resulting structure, a doped, first polysilicon film 13 is then deposited. Subsequently, a second oxide film 14 is deposited over the first polysilicon film 13. By a lithography process using a capacitor storage electrode mask, the second oxide film 14 and first polysilicon film 13 are sequentially etched to form a desired pattern. A photoresist film 15 is then coated over the entire exposed surface of the resulting structure.

The first oxide film 11 is comprised of a BPSG film.

Figure 9:
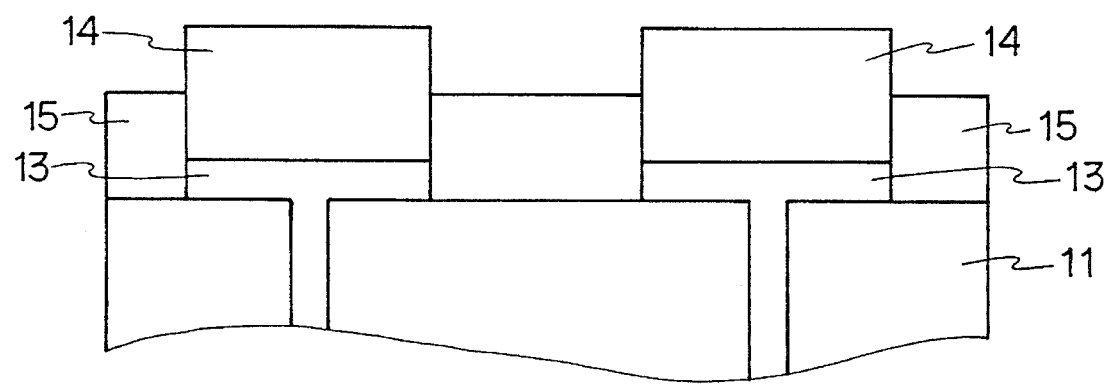

Thereafter, the photoresist film 15 is then blanket-etched to a desired depth using $O_2$ plasma such that it is left up to half the height of the second oxide film 14, as shown in FIG. 9.

Figure 10:
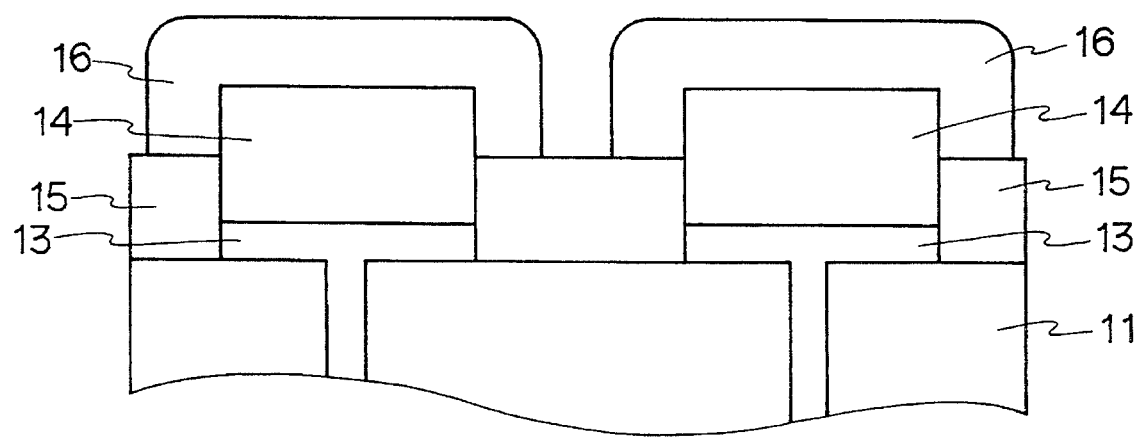

An oxide film is then selectively grown over an exposed portion of the second oxide film 14, thereby forming a third oxide film 16, as shown in FIG. 10. The third oxide film 16 is made of $O_3$-TEOS, PSG or TEOS.

Figure 11:
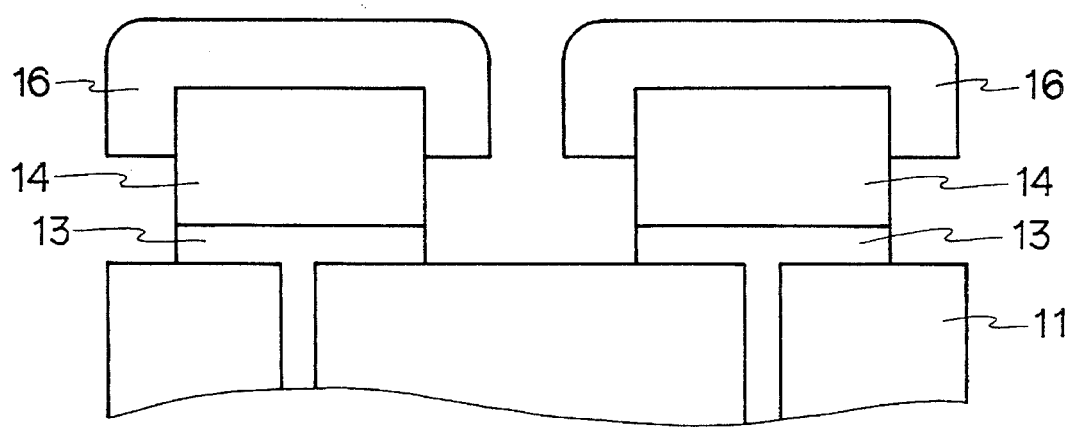

Subsequently, the remaining photoresist film 15 is completely removed using a wet etch, as shown in FIG. 11.

Figure 12:
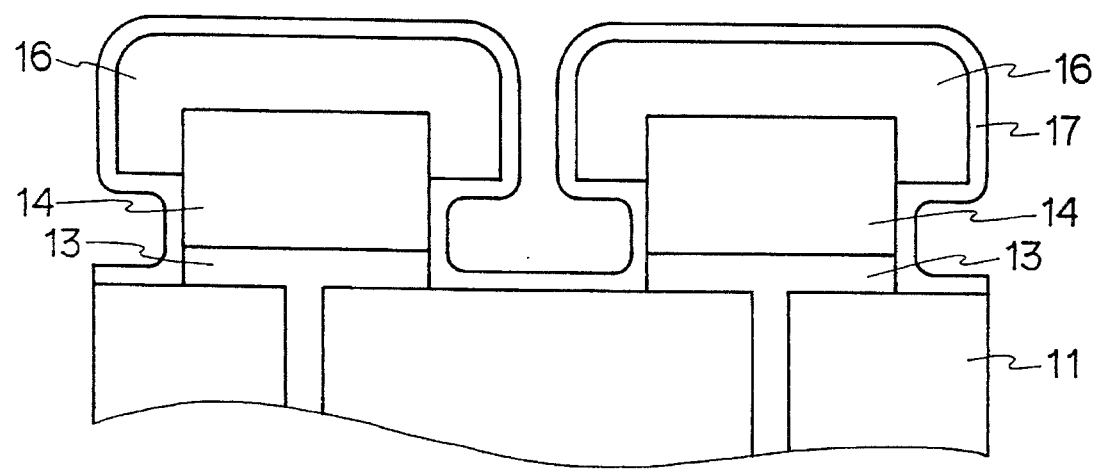

Over the entire exposed surface of the resulting structure including the third oxide film 16, a doped, second polysilicon film 17 is then deposited to a desired thickness, as shown in FIG. 12. By virtue of the good step coverage of polysilicon film, the second polysilicon film 17 is deposited in a uniform thickness even over a region defined below an overhanging portion of the third oxide film 16.

Figure 13:
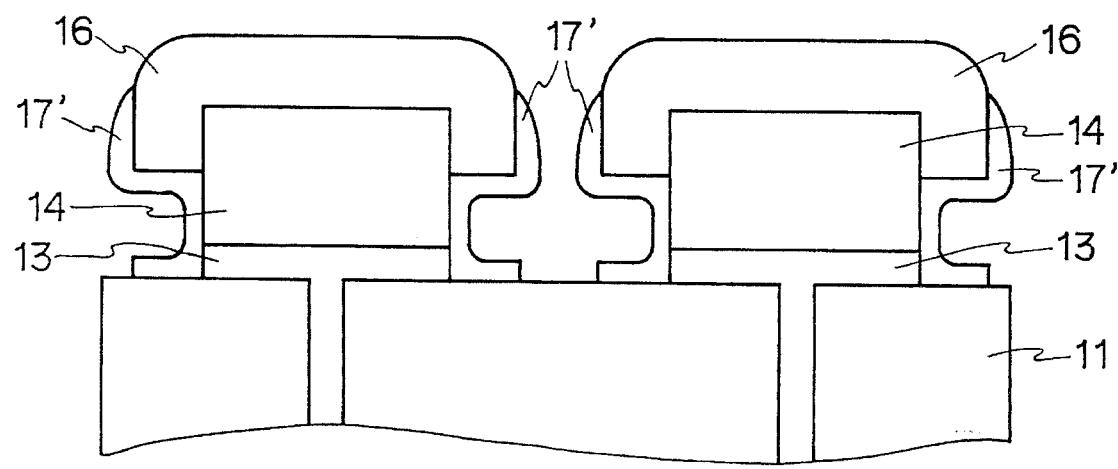

Thereafter, the second polysilicon film 17 is subjected to a blanket dry etch, thereby forming patterns 17' of the second polysilicon film 17 at opposite portions of the structure constituted by the first polysilicon film 13 and second oxide film 14, as shown in FIG. 13. One of the patterns 17' has a right 90° -inverted U shape while the other pattern 17' has a left 90° -inverted U shape. By such a shape of the patterns 17', the effective area of the capacitor is maximized.

Figure 14:
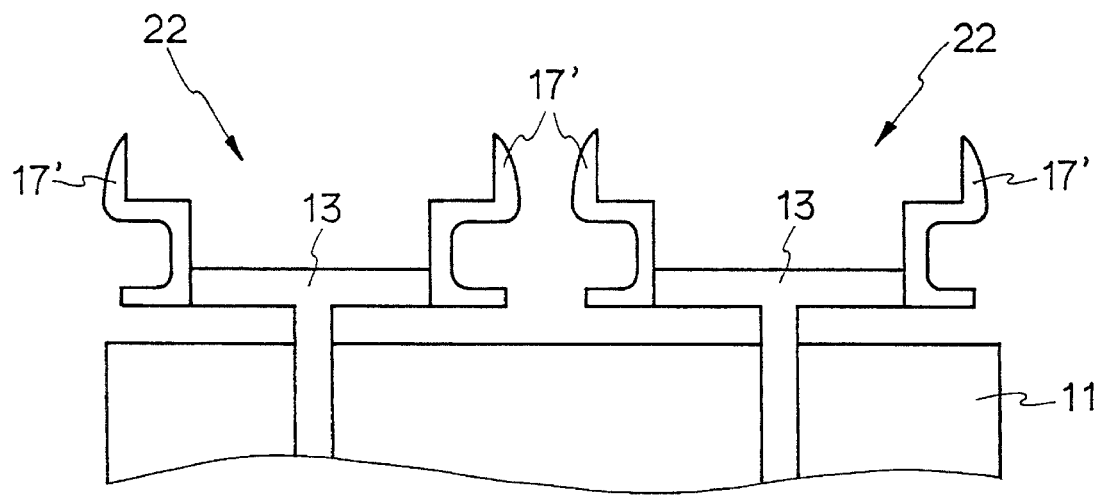

The resulting structure is then subjected to an isotropic etch, for example, using a buffer oxide etchant or an HF solution, thereby removing the third oxide film 16 and second oxide film 14, as shown in FIG. 14. Simultaneously, the first oxide film 11 disposed beneath the second polysilicon film patterns 17' and first polysilicon film 13 is etched to a required depth, thereby forming undercuts. As a result, a storage electrode 22 is obtained, which is constituted by the first polysilicon film 13 and the patterns 17' of the second polysilicon film at opposite ends of the first polysilicon film 13. By the undercuts, the storage electrode 22 has an increased effective surface area, as compared to the conventional storage electrode.

Figure 15:
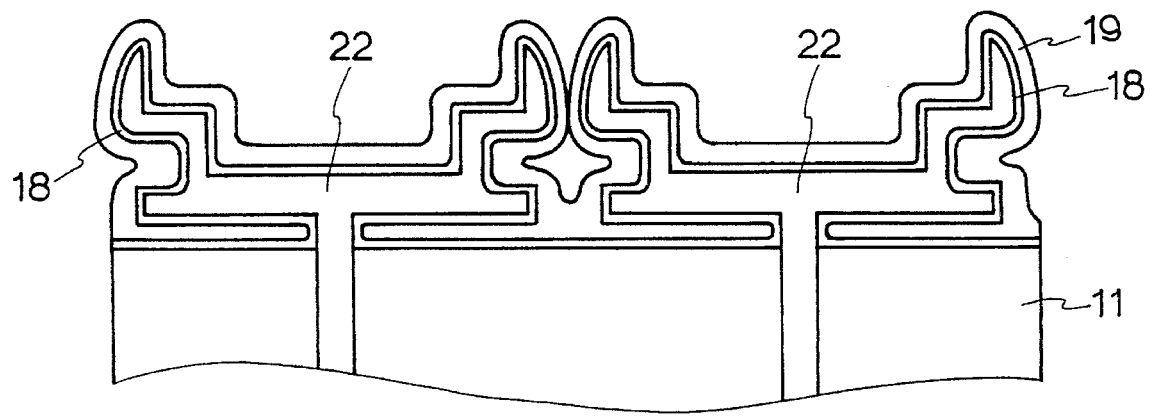

A dielectric film 18 of the capacitor is then formed over the storage electrode 22, as shown in FIG. 15. Finally, a doped polysilicon film is deposited over the resulting structure, thereby forming a plate electrode 19 of the capacitor.

As apparent from the above description, the present invention achieves an increase in the effective surface area of a storage electrode using a relatively simple fabrication method involving steps of growing a selective oxide film over an exposed surface of an oxide film patterned using a storage electrode mask, thereby forming an overhanging structure, depositing a polysilicon film exhibiting a good step coverage over the resulting structure including the overhanging structure, and forming patterns of the polysilicon film using a blanket etch, the patterns constituting side walls of a storage electrode of a capacitor to be formed so as to increase an effective area of the capacitor.

Although the preferred embodiments of the invention have been disclosed for illustrative purposes, those skilled in the art will appreciate that various modifications, additions and substitutions are possible, without departing from the scope and spirit of the invention as disclosed in the accompanying claims.

What is claimed is:

1. A method for fabricating a stack capacitor of a semiconductor device, comprising the steps of:

forming a first oxide film for a planarization over a substrate, depositing a first nitride film over the first oxide film, and then forming a capacitor contact hole in the resulting structure obtained after the deposition of the first nitride film;

depositing a doped, first polysilicon film over the entire exposed surface of the resulting structure obtained after the formation of the contact hole such that the polysilicon film fills the contact hole, and then sequentially depositing a second nitride film and a second oxide film over the first polysilicon film;

sequentially etching the second oxide film, the second nitride film and the first polysilicon film by a lithography process using a storage electrode mask, thereby forming a pattern constituted by the films left after the etching;

thickly growing a selective, third oxide film over the second oxide film;

depositing a doped, second polysilicon film over the entire exposed surface of the resulting structure obtained after the growth of the third oxide film;

etching the second polysilicon film using a blanket dry etch, thereby forming patterns of the second polysilicon film respectively on side walls of the pattern of the first polysilicon film and second nitride film;

removing the third oxide film and the second oxide film;

removing the second nitride film and the first nitride film; and forming a dielectric film over a storage electrode constituted by the pattern of the first polysilicon film and the patterns of the second polysilicon film, and then forming a plate electrode over the dielectric film.

2. A method in accordance with claim 1, wherein the third oxide film is comprised of an $O_3$-tetra ethyl ortho silicate film, a phospo silicate glass film or a tetra ethyl ortho silicate film.

3. A method for fabricating a stack capacitor of a semiconductor device, comprising the steps of:

forming a first oxide film for a planarization over a substrate, and then forming a capacitor contact hole in the resulting structure obtained after the formation of the first oxide film;

depositing a doped, first polysilicon film over the entire exposed surface of the resulting structure obtained after the formation of the contact hole such that the polysilicon film fills the contact hole, and then depositing a second oxide film over the first polysilicon film;

sequentially etching the second oxide film and the first polysilicon film by a lithography process using a storage electrode mask, thereby forming a pattern constituted by the films left after the etching;

forming a photoresist film over a portion of the first oxide film exposed after the etching such that the photoresist film extends up to a selected height portion of the second oxide film;

growing a selective, third oxide film over a portion of the second oxide film exposed after the formation of the photoresist film, and then removing the remaining photoresist film;

depositing a doped, second polysilicon film over the entire exposed surface of the resulting structure obtained after the removal of the photoresist film, and then etching the second polysilicon film using a dry etch, thereby forming patterns of the second polysilicon film respectively on side walls of the pattern of the first polysilicon film and second oxide film;

removing the third oxide film and the second oxide film and simultaneously forming undercuts beneath the patterns of the first and second polysilicon films; and forming a dielectric film over a storage electrode constituted by the patterns of the first and second polysilicon films, and then forming a plate electrode over the dielectric film.

4. A method in accordance with claim 3, wherein the third oxide film is comprised of an $O_3$-tetra ethyl ortho silicate film, a phospo silicate glass film or a tetra ethyl ortho silicate film.

5. A method in accordance with claim 3, wherein the step of forming the photoresist film comprises the steps of:

coating a photoresist film over the entire exposed surface of the resulting structure obtained after etching the second oxide film and the first polysilicon film; and blanket-etching the photoresist film to a selected depth such that the photoresist film is left up to the selected height portion of the second oxide film.

6. A method in accordance with claim 3, wherein the step of removing the third oxide film and the second oxide film and simultaneously forming the undercuts is carried out using a buffer oxide etchant or an HF solution.

* * * * *